United States Patent [19]
Takahashi

[11] Patent Number: 5,815,034
[45] Date of Patent: Sep. 29, 1998

[54] CAPACITIVE COUPLING CIRCUIT WITH DIODE-BIASED DIFFERENTIAL AMPLIFIER

[75] Inventor: Norihito Takahashi, Yamagata, Japan

[73] Assignee: NEC Corporation, Tokyo, Japan

[21] Appl. No.: 839,946

[22] Filed: Apr. 24, 1997

[30] Foreign Application Priority Data

Apr. 25, 1996 [JP] Japan ................................. 8-105218

[51] Int. Cl.$^6$ ................................................. H03F 3/45
[52] U.S. Cl. ........................ 327/563; 327/561; 330/261; 330/252
[58] Field of Search ...................... 327/560, 561, 327/562, 563; 330/286, 287, 252, 261

[56] References Cited

U.S. PATENT DOCUMENTS

| | | | |
|---|---|---|---|
| 4,558,239 | 12/1985 | Kim et al. ................................. | 307/494 |
| 5,051,628 | 9/1991 | Hanna ....................................... | 307/520 |
| 5,418,491 | 5/1995 | Bowers ..................................... | 330/252 |
| 5,432,475 | 7/1995 | Fukahori ................................... | 330/254 |

FOREIGN PATENT DOCUMENTS 1-240005  9/1989  Japan.

*Primary Examiner*—Toan Tran
*Assistant Examiner*—An T. Luu
*Attorney, Agent, or Firm*—Sughrue, Mion, Zinn, Macpeak & Seas, PLLC

[57] ABSTRACT

In an integrated-circuit capacitive coupling circuit, first and second diodes are slightly forward-biased to develop bias voltages at their cathode terminals. Input voltages are respectively applied through first and second capacitors to the cathode terminals of the diodes. A differential amplifier is formed by first and second transistors having their bases respectively connected to the cathode terminals of the diodes for receiving the bias voltages via the diodes and the input voltages via the capacitors for developing a differential output voltage. A fast charging circuit is additionally connected to the cathode terminals of the first and second diodes to supply charging currents to the capacitors for a short period in response to a control signal.

14 Claims, 5 Drawing Sheets

CAPACITIVE COUPLING CIRCUIT WITH DIODE-BIASED DIFFERENTIAL AMPLIFIER

BACKGROUND OF THE INVENTION

1. Field of the Invention

The present invention relates to an integrated-circuit capacitive coupling circuit.

2. Description of the Related Art

In the past, an integrated-circuit capacitive coupling circuit is implemented with an externally connected capacitor to meet the requirement of low frequency applications due to the difficulty in forming a large capacitor on an integrated-circuit chip. However, the general tendency is toward using integrated-circuit chips and so the integration of a capacitor with the capacitive coupling circuit is no exception.

Japanese Laid-Open Patent Specification Hei-1-240005 discloses a single-port integrated-circuit capacitive coupling circuit in which a capacitor is implemented with a bias circuit and a differential amplifier on an integrated-circuit chip. However, the value of the integrated-circuit capacitor is still not satisfactory for some applications which require that the coupling frequency be as low as possible. In addition, it does cause a number of problems. The most important problem of the prior art Specification is the large dc offset voltage associated with the high input impedance of the capacitive coupling circuit. The other problems include the long transient recovery time and the need to provide an extra circuit and space for canceling common noise.

SUMMARY OF THE INVENTION

It is therefore an object of the present invention to provide a capacitive coupling circuit having a reduced dc offset voltage.

Another object of the present invention is to provide a capacitive coupling circuit having a low coupling frequency.

A further object of the present invention is to provide a capacitive coupling circuit having a small transient recovery time.

A still further object of the present invention is to provide a capacitive coupling circuit having a canceling effect for common noise and undesired voltage variations.

According to the present invention, there is provided a capacitive coupling circuit comprising a bias circuit including first and second diodes and means for forward-biasing the first and second diodes and producing bias voltages at the cathode terminals of the first and second diodes, the bias circuit having an impedance of substantially infinite value across the cathode terminals. First and second capacitive elements are provided for respectively applying input voltages to the cathode terminals of the first and second diodes. A differential amplifier includes first and second transistors having controlling (or base) terminals respectively connected to the cathode terminals of the first and second diodes for receiving the bias voltages via the diodes and the input voltages via the capacitive elements for developing a differential output voltage across a controlled terminal (collector) of the first transistor and a controlled terminal (collector) of the second transistor.

The capacitive coupling circuit of this invention further includes a fast charging circuit connected to the cathode terminals of the first and second diodes. The fast charging circuit supplies charging currents to the first and second capacitive elements for a predetermined short period of time in response to a control signal which may be associated with large voltage variations and power on-off operation.

BRIEF DESCRIPTION OF THE DRAWINGS

The present invention will be described in further detail with reference to the accompanying drawings, in which.

DETAILED DESCRIPTION

Figure 1:
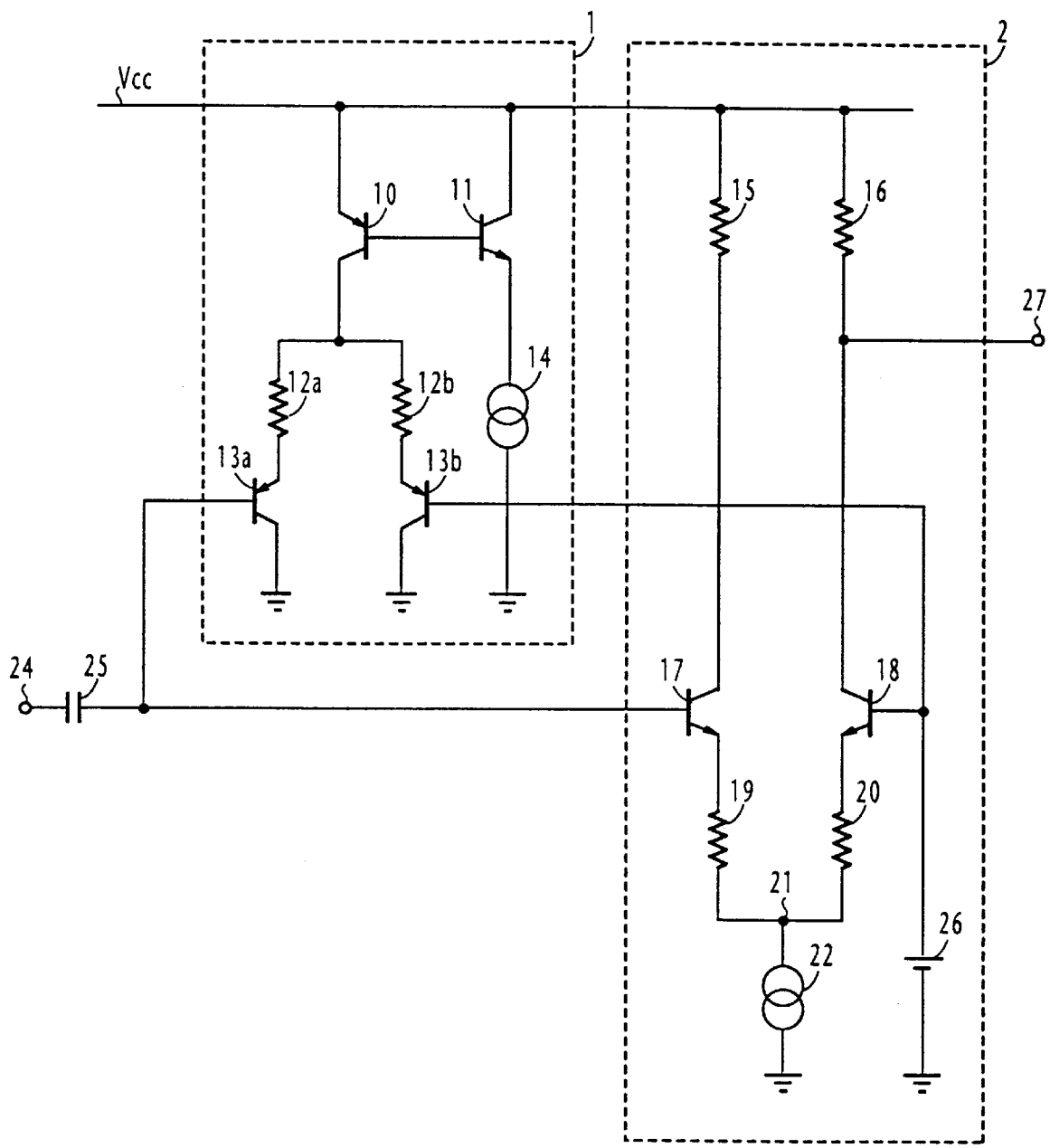
FIG. 1 is a circuit diagram of a prior art integrated-circuit capacitive coupling circuit.

Before proceeding with the detailed description of the present invention, it may prove helpful to provide an explanation of the integrated-circuit capacitive coupling circuit of the aforesaid Japanese Laid-Open Patent Specification with reference to FIG. 1. As shown, the capacitive coupling circuit comprises a bias circuit 1 and a differential amplifier 2. Bias circuit 1 includes a PNP transistor 10 and an NPN transistor 11, the emitter and the collector of transistors 10, 11 being respectively connected to voltage line Vcc. The collector of transistor 10 is connected to a series circuit of resistor 12a and the emitter-collector path of PNP transistor 13a to ground and a 18 series circuit of resistor 12b and the emitter-collector path of PNP transistor 13b. The emitter of transistor 11 is connected through a constant current source 14 to ground.

In the differential amplifier 2, the voltage line Vcc is connected through resistors 15, 16, the collector-emitter paths of NPN transistors 17, 18 and through resistors 19, 20 to a circuit node 21 which is grounded through a constant current source 22. The bases of transistors 13a and 17 are connected together to a circuit node 23 to which an input signal at terminal 24 is applied through a capacitor 25 and the bases of transistors 13b and 20 are connected together to a constant voltage source 26, forming a negative feedback loop through transistors 13b, 13a, 17, resistor 19 and constant current source 22 so that the bases of transistors 17 and 18 are maintained at the same potential. Between resistor 16 and the collector of transistor 18 is connected an output terminal 27.

The capacitive coupling circuit has a coupling frequency determined by the relation $1/(2\pi \times C \times Z_{in})$, where C is the value of capacitor 25 and $Z_{in}$ is the input impedance of the circuit measured at terminal 24. However, since a high-value capacitor is difficult to implement on an integrated-circuit chip, the input impedance would have to be increased if the desired coupling frequency must be implemented with a low capacitance. Although the input impedance of the capacitive coupling circuit could be increased by increasing the values of resistors 12a, 12b, 19, the use of high values for these resistors results in an increase in the maximum input offset voltage $V_{max}$ of the differential amplifier 2 which is given by the relation:

$$V_{max} = \frac{V_T + R_{12} \times I_{14}}{V_T \times V_{off}} \quad (1)$$

where, $V_T$=the volt equivalent of temperature represented by k.T/q (where k is the Boltzman constant, T the operating temperature and q the electronic charge), $I_{14}$=the current supplied from constant current source 14,
$R_{12}$=the resistance of each of resistors 12a and 12b, and
$V_{off}$=an offset voltage developed at the input of differential amplifier 2 if the bias circuit 1 were not provided.

One major problem of the prior art is that it is not satisfactory for applications where a large dc input offset voltage is not allowed. Due to the difficulty to implement a large capacitor on an integrated-circuit chip, the input impedance $Z_{in}$ of the capacitive coupling circuit must be increased to achieve a desired low coupling frequency. Since the input impedance $Z_{in}$ of the prior art is given by the parallel impedances of the bias circuit 1 and the differential amplifier 2 as follows:

$$Z_{in}=h_{fe13}(V_T/I_{14}+R_{12})\|h_{fe17}(2V_T/I_{22}+R_{19}) \quad (2)$$

where,
$I_{14}$=the current of constant current source 14,
$R_{12}$=the resistance value of each of resistors 12a and 12b,
$I_{22}$=the current of constant current source 22,
$R_{19}$=the resistance value of resistor 19,
$h_{fe13}$=the small-signal current gain of transistors 13a, 13b, and
$h_{fe17}$=the small-signal current gain of transistor 17, the attempt to increase the $Z_{in}$ value would increase the values of resistors 12a, 12b and 19. However, this results in an undesirable increase in dc input offset voltage.

Furthermore, the implementation of a capacitive coupling circuit on an integrated-circuit chip makes it difficult to meet the need of low frequency applications due to the difficulty to achieve a desired capacitance. In practice, the input impedance $Z_{in}$ of the prior art circuit is 500 kiloohms to satisfy the dc offset requirement. Using a 20-pF integrated-circuit capacitor 4, the coupling frequency of the prior art is 16 kHz.

In addition, the prior art uses only one bias circuit 1. Therefore, it is only useful for applications where high operating performance is not required. If cancellation of undesired signals is important, two bias circuits 1 would be required to provide inputs to the differential amplifier 2, requiring an extra space on an integrated-circuit chip.

On the other hand, the transient recovery time of a capacitive coupling circuit is another concern since it determines the ability of the circuit to attain stability after power is turned on or after a large input voltage fluctuation occurred. Since the transient recovery time of a capacitive coupling circuit is determined by the product of the capacitance and the input impedance of the circuit, the prior art coupling circuit is not satisfactory for applications where high speed transient recovery is important and low coupling frequency is desired.

Figure 2:
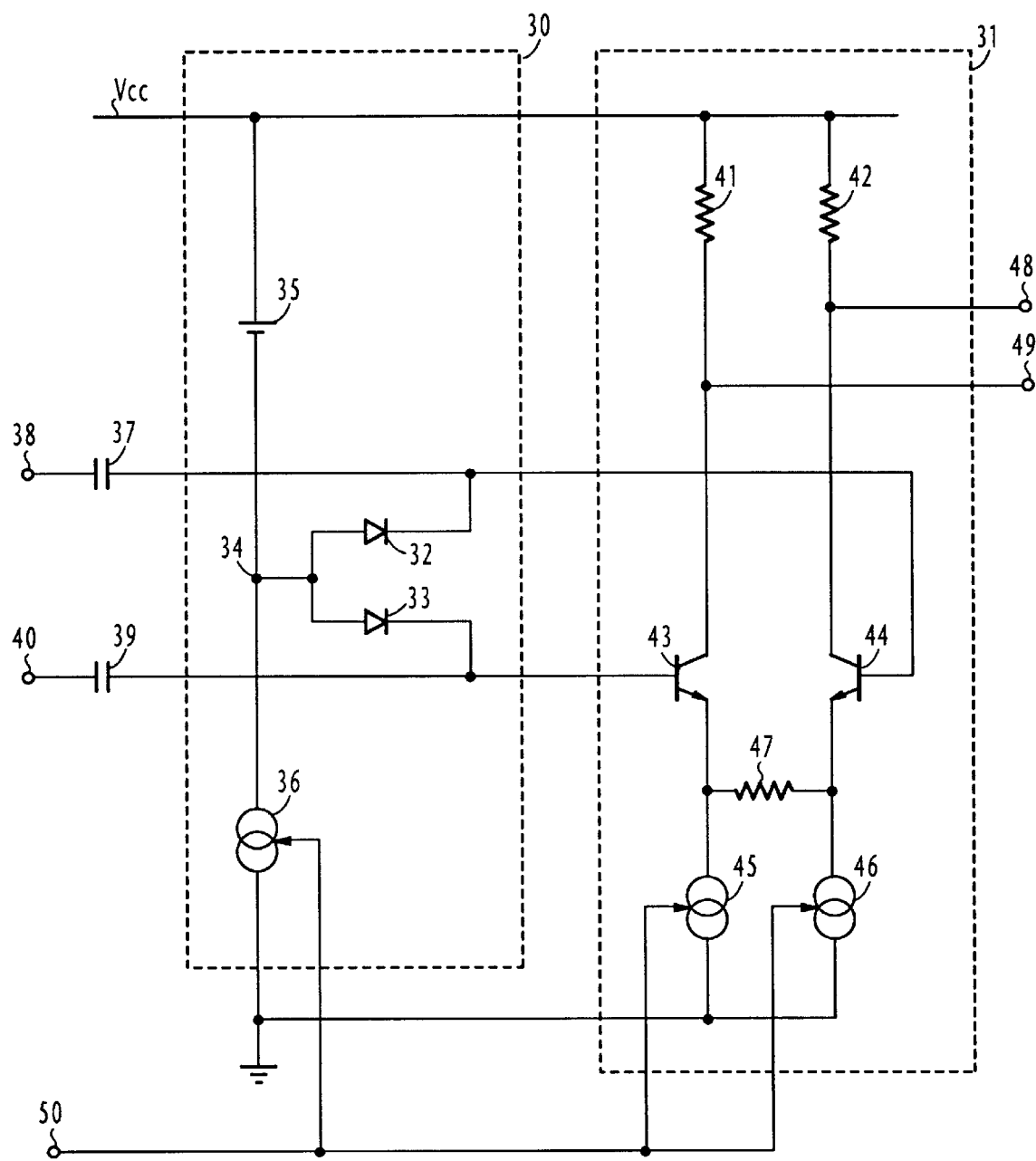
FIG. 2 is a circuit diagram of an integrated-circuit capacitive coupling circuit according to a first embodiment of the present invention.

Referring to FIG. 2, an integrated-circuit capacitive coupling circuit according to one embodiment of the present invention comprises a two-port bias circuit 30 and a differential amplifier 31. Bias circuit 30 includes a pair of diodes 32 and 33. The anode terminals of both diodes are connected together to a circuit node 34 of the circuit between the low-voltage terminal of a constant voltage source 35 and one end of a constant current source 36. The high-voltage terminal of the constant voltage source 35 is connected to voltage line Vcc and the other end of the constant current source 36 is connected to ground. The cathode terminal of diode 32 is connected through a capacitor 37 to input terminal 38 and the cathode terminal of diode 33 is connected through a capacitor 39 to input terminal 40.

In the differential amplifier 31, the voltage line Vcc is connected through resistors 41, 42 and the collector-emitter paths of NPN transistors 43, 44 and through constant current sources 45, 46 to ground, and a resistor 47 is connected across the emitters of transistors 43 and 44. The bases of transistors 43 and 44 are connected respectively to the cathode terminals of diodes 32 and 33. Output terminals 48 and 49 are connected to the collectors of transistors 43 and 44.

A power on-off signal is supplied from a terminal 50 to constant current sources 36, 45 and 46 to turn them off when the capacitive coupling circuit is not operating.

The voltage at the anode terminals of diodes 32 and 33 is determined by the constant voltage source 35 and constant current source 36 so that the diodes are slightly forward-biased only sufficiently to bias the base of transistors 43 and 44. However, when the input signal is applied, the impedance of the bias circuit as viewed from the cathode terminals of the diodes assumes an infinite value as if the diodes were backward-biased.

The dc offset voltage of the capacitive coupling circuit is determined by the difference between the bias voltages generated at the cathode terminals of diodes 32, 33 and the difference between the base-emitter voltages of transistors 43 and 44. Since the operating characteristics of diodes 32, 33 and transistors 43, 44 can be precisely controlled, the dc offset voltage can be maintained at a level lower than 2 millivolts. In addition, the use of two-port bias circuit 30 enables the differential amplifier 31 to cancel undesired voltage variations which are introduced to the input terminals 38 and 40 as a common noise.

Since the bias circuit 30 has an impedance of infinite value across the cathode terminals of diodes 32, 33, the total input impedance of the capacitive coupling circuit is substantially equal to the impedance $Z_{in}$ of the differential amplifier 31 which is given by:

$$Z_{in}=h_{fe43}(V_T/I_{45})+R_{47}/2 \quad (3)$$

where,
$h_{fe43}$=the small-signal current gain of transistor 43,
$I_{45}$=the current of constant current source 45, and
$R_{47}$=the resistance of resistor 47.

If $I_{45}$ =50 μA, $R_{47}$ =20 kiloohms, and $h_{43}$=100, the input impedance $Z_{in}$ of the present invention is approximately equal to 1 megohms. Using a 20-pF integrated-circuit capacitors 37 and 39, the coupling frequency of this invention is approximately equal to 8 kHz, which favorably compares with the prior art coupling frequency of 16 kHz.

Figure 3:
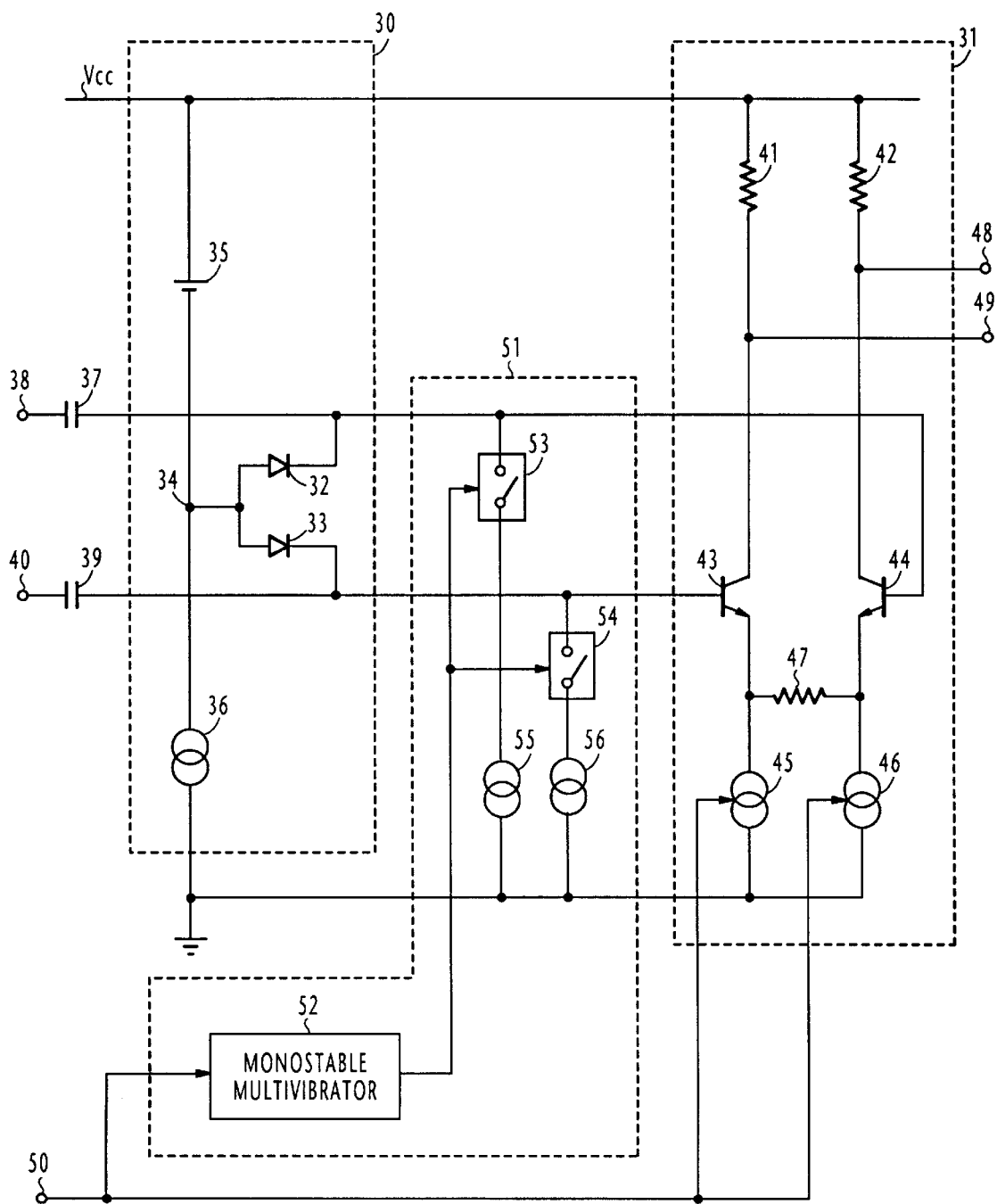
FIG. 3 is a circuit diagram of an integrated-circuit capacitive coupling circuit according to a second embodiment of the present invention.

A second embodiment of the present invention is shown in FIG. 3. This embodiment differs from the first embodiment by the provision of a fast charging circuit 51 formed by a monostable multivibrator 52, normally-open switches 53, 54 and constant current sources 55, 56.

Figure 4:
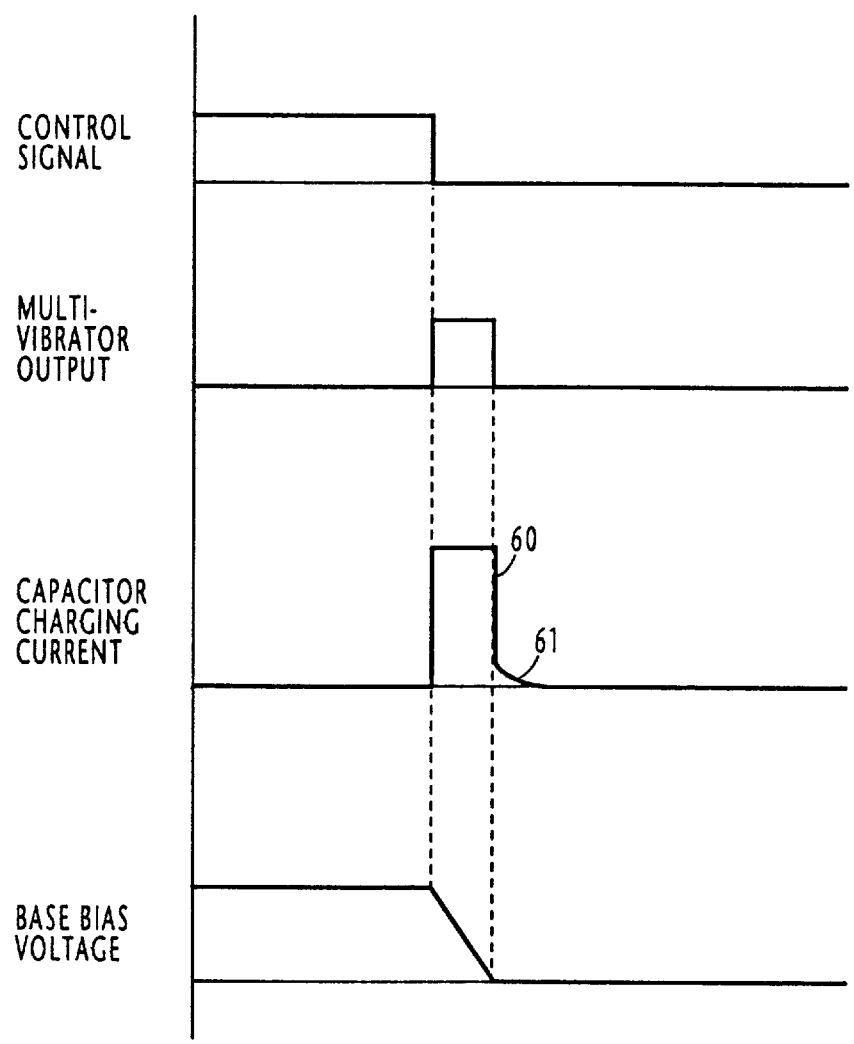
FIG. 4 is a timing diagram that explains the operation of the circuit of FIG. 3.

As shown in FIG. 4, monostable multivibrator 52 is responsive to a high-to-low transition of the power on-off signal from terminal 50 for briefly closing the switches 53 and 54 for respectively coupling the capacitors 37 and 39 via constant current sources 55, 56 to ground. As a result, each of the capacitors 37 and 39 is quickly charged with a large current pulse 60, followed by a small base current 61 of each of transistors 43 and 44 which decays with time, and the bias voltage at the base of each of transistors 43, 44 rapidly changes from a high level to a low level. In this way, the capacitive coupling circuit has a reduced transient recovery time which is as low as few microseconds. In comparison, the transient recovery time of the FIG. 2 embodiment is several tens of milliseconds.

Figure 5:
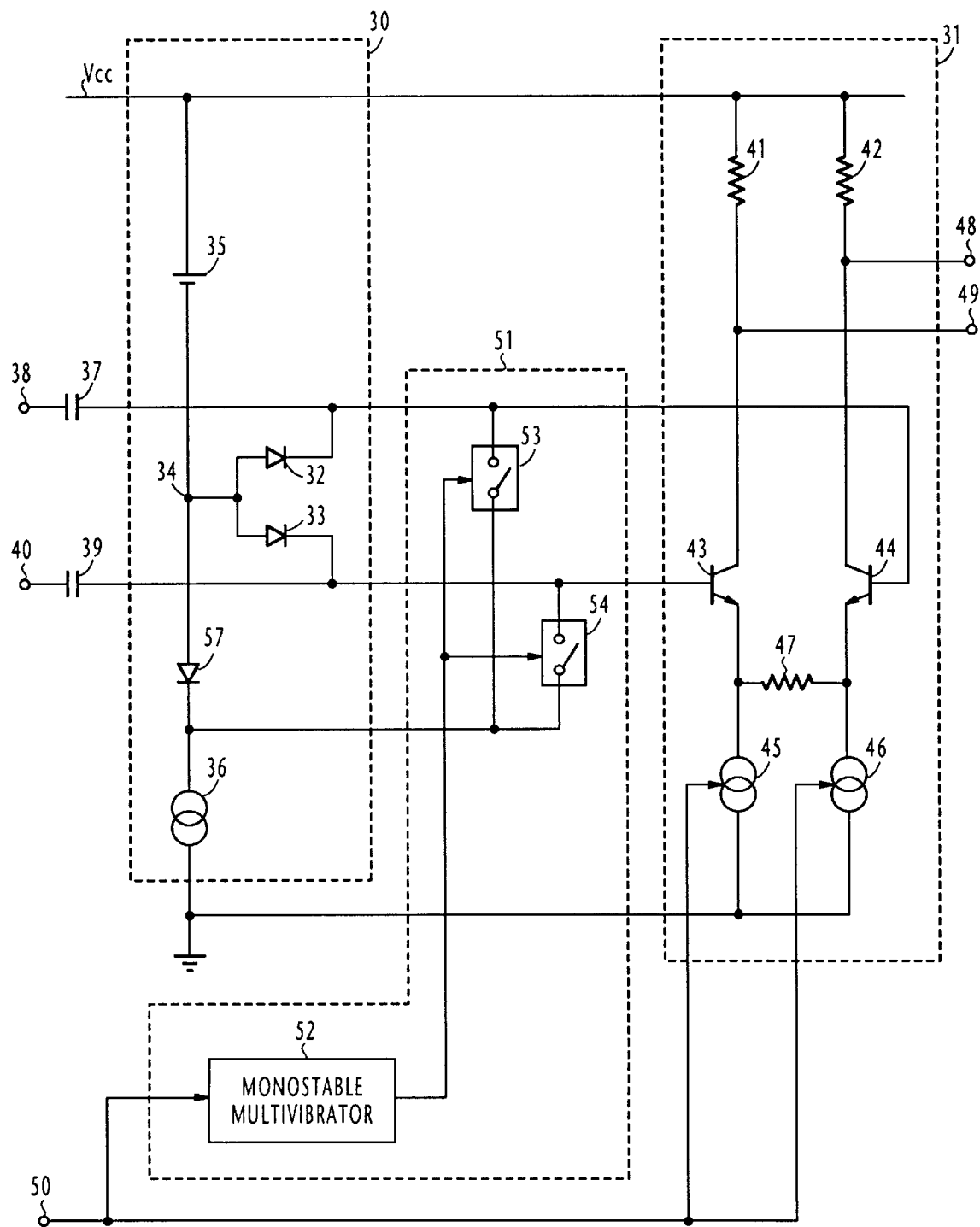
FIG. 5 is a circuit diagram of an integrated-circuit capacitive coupling circuit of the modification of FIG. 4.

FIG. 5 shows an alternative form of the embodiment of FIG. 3. In this modification, a diode 57 is used instead of the constant current sources 55 and 56 of FIG. 3 Diode 57 is connected between node 34 and constant current source 36 and the switches 53 and 54 are connected together to constant current source 36. Diode 57 has the effect of developing a forward voltage drop when the switches 53 and 54 are turned on. This forward voltage is equal to the forward voltage drop developed by each of the diodes 32, 33 when the switches 53, 54 are in the turn-off state. If the diode 57 were not provided, voltage variations would otherwise occur at the gates of transistors 43, 44 when switches 53, 54 are turned on and off. Due to the voltage developed by the diode 57 when switches 53, 54 are turned on, no voltage variations occur at the gates of transistors 43, 44 even though switches 53, 54 are turned on and off.

What is claimed is:

1. A capacitive coupling circuit comprising:

a bias circuit including first and second diodes and means for forward-biasing said first and second diodes and producing bias voltages at the cathode terminals of the first and second diodes, said bias circuit having an impedance of substantially infinite value across said cathode terminals;

first and second capacitive elements for respectively applying input voltages to the cathode terminals of said first and second diodes; and a differential amplifier including first and second transistors having controlling terminals respectively connected to the cathode terminals of said first and second diodes for receiving said bias voltages via said diodes and said input voltages via said capacitive elements and for developing a differential output voltage across a controlled terminal of the first transistor and a controlled terminal of the second transistor.

2. A capacitive coupling circuit as claimed in claim 1, wherein the means for forward-biasing said diodes comprises a series circuit of a constant voltage source and a constant current source, said series circuit being connected between first and second potentials, the anode terminals of said first and second diodes being connected together to a node between said constant current source and said constant voltage source.

3. A capacitive coupling circuit as claimed in claim 1, wherein said differential amplifier comprises:

a first series circuit including a resistor and a constant current source, said first transistor being connected in series between the resistor and the constant current source, said first series circuit being connected between first and second potentials and forming first and second circuit nodes across controlled terminals of said first transistor;

a second series circuit including a resistor and a constant current source, said second transistor being connected in series between the resistor and the constant current source, said second series circuit being connected between said first and second potentials and forming third and fourth circuit nodes across controlled terminals of said second transistor;

a resistor connected between said first and third circuit nodes; and first and second output terminals connected respectively to said second and fourth circuit nodes.

4. A capacitive coupling circuit as claimed in claim 1, further comprising a charging circuit connected to the cathode terminals of said first and second diodes for supplying charging currents to said first and second capacitive elements for a predetermined period in response to a control signal.

5. A capacitive coupling circuit as claimed in claim 4, wherein said charging circuit comprises:

first and second constant current sources;

means for producing a pulse in response to said control signal; and first and second switches responsive to said pulse for establishing connections between the first and second constant current sources and the cathode terminals of said first and second diodes for supplying said charging currents to said capacitive elements from the first and second constant current sources.

6. A capacitive coupling circuit as claimed in claim 1, wherein the means for forward-biasing said diodes comprises a series circuit of a first constant voltage source and a constant current source, said series circuit being connected between first and second potentials, the anode terminals of said first and second diodes being connected together to a node between said first constant current source and said constant voltage source, further comprising:

second and third constant current sources;

means for producing a pulse in response to a control signal; and first and second switches responsive to said pulse for establishing connections between said second and third constant current sources and the cathode terminals of said first and second diodes for supplying charging currents to said first and second capacitive elements from the second and third constant current sources, respectively.

7. A capacitive coupling circuit as claimed in claim 1, wherein the means for forward-biasing said diodes comprises a series circuit of a first constant voltage source and a constant current source, said series circuit being connected between first and second potentials, the anode terminals of said first and second diodes being connected together to a circuit node between said first constant current source and said constant voltage source, further comprising:

a third diode connected in said series circuit between said constant voltage source and said circuit node;

means for producing a pulse in response to a control signal; and first and second switches responsive to said pulse for establishing connections between said constant current source and the cathode terminals of said first and second diodes for supplying charging currents to said first and second capacitive elements from said constant current source.

8. A capacitive coupling circuit as claimed claim 1, wherein said first and second capacitive elements are assembled with said bias circuit and said differential amplifier on an integrated-circuit chip.

9. A capacitive coupling circuit as claimed claim 2, wherein said first and second capacitive elements are assembled with said bias circuit and said differential amplifier on an integrated-circuit chip.

10. A capacitive coupling circuit as claimed claim 3, wherein said first and second capacitive elements are assembled with said bias circuit and said differential amplifier on an integrated-circuit chip.

11. A capacitive coupling circuit as claimed claim 4, wherein said first and second capacitive elements are assembled with said bias circuit and said differential amplifier on an integrated-circuit chip.

12. A capacitive coupling circuit as claimed claim 5, wherein said first and second capacitive elements are assembled with said bias circuit and said differential amplifier on an integrated-circuit chip.

13. A capacitive coupling circuit as claimed claim 6, wherein said first and second capacitive elements are assembled with said bias circuit and said differential amplifier on an integrated-circuit chip.

14. A capacitive coupling circuit as claimed claim 7, wherein said first and second capacitive elements are assembled with said bias circuit and said differential amplifier on an integrated-circuit chip.

* * * * *